(12) United States Patent
Lai et al.

(10) Patent No.: US 7,936,243 B2
(45) Date of Patent: May 3, 2011

(54) ADJUSTABLE RESISTOR EMBEDDED IN MULTI-LAYERED SUBSTRATE AND METHOD FOR FORMING THE SAME

(75) Inventors: Ying-Jiunn Lai, Pingtung County (TW); Chang-Sheng Chen, Taipei (TW); Chin-Sun Shyu, Pingtung County (TW); Uei-Ming Jow, Taichung (TW); Chang-Lin Wei, Miaoli County (TW)

(73) Assignee: Industrial Technology Research Institute, Hsinchu (TW)

( * ) Notice: Subject to any disclaimer, the term of this patent is extended or adjusted under 35 U.S.C. 154(b) by 648 days.

(21) Appl. No.: 11/488,608

(22) Filed: Jul. 19, 2006

(65) Prior Publication Data

US 2007/0222552 A1  Sep. 27, 2007

(30) Foreign Application Priority Data

Mar. 24, 2006 (TW) .............................. 95110179 A

(51) Int. Cl.
*H01F 27/28* (2006.01)
(52) U.S. Cl. ........ 336/195; 338/295; 338/308; 338/323; 338/327
(58) Field of Classification Search .................. 338/308, 338/195, 295, 306, 307, 323, 327, 328
See application file for complete search history.

(56) References Cited

U.S. PATENT DOCUMENTS

| | | | | | |
|---|---|---|---|---|---|
| 3,329,921 | A | * | 7/1967 | Badelt | 338/308 |
| 4,150,366 | A | * | 4/1979 | Price | 341/121 |
| 4,228,418 | A | * | 10/1980 | Piedmont et al. | 338/195 |
| 4,283,774 | A | * | 8/1981 | Schwartz et al. | 365/8 |
| 4,443,782 | A | | 4/1984 | Poirier d'Ange d'Orsay | |
| 4,870,746 | A | * | 10/1989 | Klaser | 29/620 |
| 4,878,847 | A | * | 11/1989 | Rutledge | 439/74 |
| 4,899,126 | A | * | 2/1990 | Yamada | 338/309 |
| 5,285,184 | A | * | 2/1994 | Hatta et al. | 338/313 |
| 5,363,084 | A | * | 11/1994 | Swinehart | 338/308 |
| 5,394,019 | A | * | 2/1995 | Audy | 327/525 |
| 5,493,148 | A | * | 2/1996 | Ohata et al. | 257/538 |
| 5,640,137 | A | * | 6/1997 | Mantha | 338/308 |
| 2006/0181389 | A1 | * | 8/2006 | Cho | 338/309 |

FOREIGN PATENT DOCUMENTS

| | | |
|---|---|---|
| EP | 0 327 078 A2 | 2/1989 |
| EP | 1 045 626 A1 | 10/2000 |

* cited by examiner

*Primary Examiner* — Elvin G Enad
*Assistant Examiner* — Joselito Baisa
(74) *Attorney, Agent, or Firm* — Birch, Stewart, Kolasch & Birch, LLP

(57) ABSTRACT

An adjustable resistor embedded in a multi-layered substrate and method for forming the same. The adjustable resistor comprises: a planar resistor, having a plurality of terminals; and a plurality of connecting lines connected to the planar resistor, each of the connecting lines being drawn from each of the terminals of the planar resistor so as to form a resistor network, wherein the connecting lines are selectively broken by a process for drilling the substrate to form a number of combinations of opened connecting lines such that the resistance value of the adjustable resistor is varied and thus the resistance value of the adjustable resistor can be precisely adjusted.

18 Claims, 7 Drawing Sheets

| Drilling Position Selection | Selecting Drilling Position | Selecting Drilling Position | Adjustable Resistance |
|---|---|---|---|
| 0 | | | 5000 |
| 1 | | 1 | 5011 |
| 2 | | 12 | 5014 |
| 3 | | 123 | 5020 |
| 4 | | 1234 | 5033 |
| 5 | | 12345 | 5100 |
| 6 | A | 1 | 5111 |
| 7 | A | 12 | 5114 |
| 8 | A | 123 | 5120 |
| 9 | A | 1234 | 5133 |
| 10 | A | 12345 | 5200 |
| 11 | F | 16 | 5214 |
| 12 | BF | 16 | 5215 |
| 13 | BF | 126 | 5220 |
| 14 | BCF | 126 | 5223 |
| 15 | BCF | 1236 | 5233 |
| 16 | BCDF | 1236 | 5246 |
| 17 | F | 56 | 5300 |
| 18 | AB | 12 | 5314 |
| 19 | AB | 123 | 5320 |
| 20 | AB | 1234 | 5333 |
| 21 | AB | 12345 | 5400 |
| 22 | EF | 456 | 5500 |
| 23 | ABC | 123 | 5520 |
| 24 | ABC | 1234 | 5533 |
| 25 | ABC | 12345 | 5600 |
| 26 | DEF | 3456 | 5700 |
| 27 | ABCD | 1234 | 5733 |
| 28 | ABCD | 12345 | 5800 |
| 29 | CDEF | 12345 | 5900 |
| 30 | ABCDE | 12345 | 6000 |

FIG. 4

ADJUSTABLE RESISTOR EMBEDDED IN MULTI-LAYERED SUBSTRATE AND METHOD FOR FORMING THE SAME

BACKGROUND OF THE INVENTION

1. Field of the Invention

The present invention generally relates to an adjustable resistor embedded in a multi-layered substrate and method for forming the same and, more particularly, to an adjustable resistor and a method for forming the adjustable resistor using a mechanical drilling process to selectively break the connecting lines to form a number of combinations of opened connecting lines such that the resistance value of the adjustable resistor can be precisely adjusted.

2. Description of the Prior Art

It is well known that resistors have been widely used in circuit applications such as restrictors, regulators and terminator controllers, etc. however, most small-size resistors are implemented using surface mounted technique (SMT). Even though resistors are developed to be smaller and more compact, they still have to be installed on the surface of multi-layered substrate, which increases the area and height of the physical layer. In order to embed the resistors in the multi-layered substrate, there have been many reports on the circuit applications of coated resistors. However, the coated resistors require a precise laser mechanism or a sand-blasting grinder to perform fine-tuning because of the resistance inaccuracy due to improper recipe and screen printing. Moreover, such a method is only effective for the fine-tuning of surface coated resistors.

For commercially available thick-film resistors (TFR's), the printing ink is unstable when it is coated on the substrate. Therefore, a fixed resistance value does not exist. The variance between the resistance value and the estimated value is about ±20%. In order to precisely obtain the designed resistance value, an additional trimming process after the formation of the thick-film resistors is required. The additional trimming process includes sand-blasting trimming and laser trimming.

Sand-blasting trimming uses a nozzle to discharge an abrasive with a high-pressure gas. The thick-film resistor layer is grinded with the abrasive so as to trim the shape of thick-film resistor layer. Sand-blasting trimming is advantageous for its non-thermal process. However, sand-blasting trimming leads to exposure of the resistor edge and powder contamination and fails to achieve high-precision trimming. Laser trimming uses the heat generated from laser so as to oxidize the material of the resistor layer and form a gap of 2 to 2.5 mil. Laser trimming is advantageous for its high elimination rate, computer-controllable automation, precise and fast treatment. Moreover, laser trimming can be performed on a high-integrity circuit board. However, it is also problematic for its cracks due to thermal shock.

In U.S. Pat. No. 4,443,782, entitled "Method for Regulating the Value of a Thick Film Resistor and a Corresponding Resistor", a plurality of slots in the resistor material region are used to adjust the resistance value of the surface coated resistors. Even though U.S. Pat. No. 4,443,782 does not disclose how the slots are formed, laser trimming is mostly used to adjust the resistance value.

The conventional technology related to surface coated resistors cannot be applied to embedded resistors. Therefore, there exists a need in providing an adjustable resistor embedded in a multi-layered substrate and method for forming the same. The adjustable resistor comprises: a planar resistor, having a plurality of terminals; and a plurality of connecting lines connected to the planar resistor, each of the connecting lines being drawn from each of the terminals of the planar resistor so as to form a resistor network, wherein the connecting lines are selectively broken by a process for drilling the substrate to form a number of combinations of opened connecting lines such that the resistance value of the adjustable resistor is varied and thus the resistance value of the adjustable resistor can be precisely adjusted.

SUMMARY OF THE INVENTION

It is a primary object of the present invention to provide an adjustable resistor embedded in a multi-layered substrate. The adjustable resistor forms a resistor network. The connecting lines are selectively broken by a process for drilling the substrate to form a number of combinations of opened connecting lines such that the resistance value of the adjustable resistor is varied and thus the resistance value of the adjustable resistor can be precisely adjusted.

It is a secondary object of the present invention to provide a method for forming an adjustable resistor embedded in a multi-layered substrate. Firstly, a planar resistor and a plurality of connecting lines connected to the planar resistor are formed, each of the connecting lines being drawn from each of the terminals of the planar resistor so as to form a resistor network. Then, the connecting lines are selectively broken by a process for drilling the substrate to form a number of combinations of opened connecting lines such that the resistance value of the adjustable resistor is varied and thus the resistance value of the adjustable resistor can be precisely adjusted.

In order to achieve the foregoing objects, the present invention provides an adjustable resistor embedded in a multi-layered substrate and a method for forming the same. The adjustable resistor comprises: a planar resistor, having a plurality of terminals; and a plurality of connecting lines connected to the planar resistor, each of the connecting lines being drawn from each of the terminals of the planar resistor so as to form a resistor network, wherein the connecting lines are selectively broken by a process for drilling the substrate to form a number of combinations of opened connecting lines such that the resistance value of the adjustable resistor is varied and thus the resistance value of the adjustable resistor can be precisely adjusted.

BRIEF DESCRIPTION OF THE DRAWINGS

The objects, spirits and advantages of the preferred embodiments of the present invention will be readily understood by the accompanying drawings and detailed descriptions, wherein:

FIG. 4 is a table showing the resistance value of an adjustable resistor embedded in a multi-layered substrate according to the preferred embodiment of the present invention;

DETAILED DESCRIPTION OF THE PREFERRED EMBODIMENT

The present invention providing an adjustable resistor embedded in a multi-layered substrate and method for forming the same can be exemplified by the preferred embodiments as described hereinafter.

Figure 1:
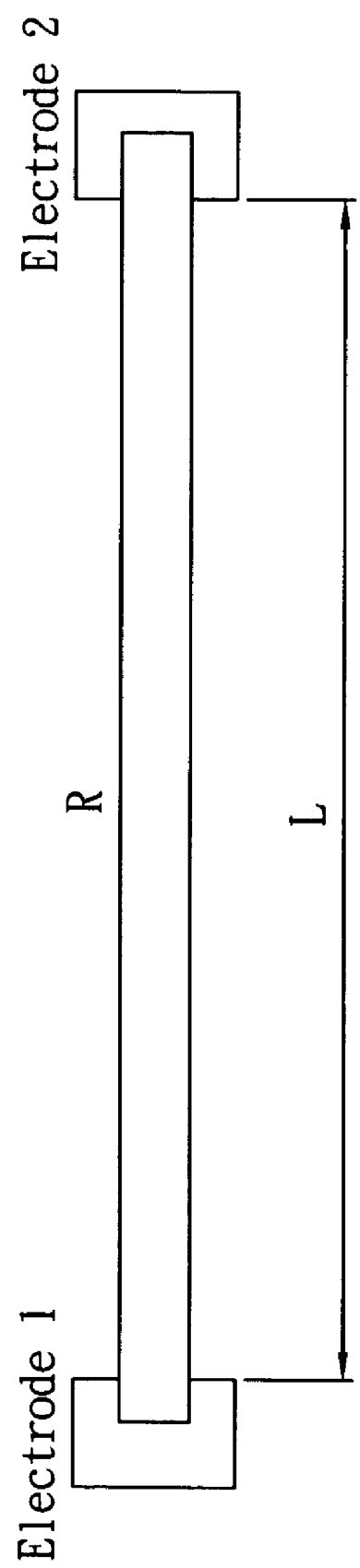
FIG. 1 is a schematic diagram showing a conventional surface coated resistor.

Please refer to FIG. 1, which is a schematic diagram showing a conventional surface coated resistor. The resistance value of the surface coated resistor R can be expresses as $R=\rho L/A$, which indicates that the resistance value R is proportional to the resistivity $\rho$ and the resistor length L, while being inversely proportional to the cross-sectional area A of the resistor. If the resistivity $\rho$ and the cross-sectional area A of a surface coated resistor are fixed, the resistance value R between the electrode 1 and the electrode 2 depends only on the resistor length L through which the electric current flows.

In the manufacturing of the conventional surface coated resistor, non-uniform coating of the resistor material, the burr on the edge of the resistor material or unreliable baking processing often leads to inaccuracy of the resistance value. Moreover, the conventional tuning technology of resistance related to surface coated resistors cannot be applied to embedded resistors. Therefore, there exists a need in providing an adjustable resistor embedded in a multi-layered substrate so as to overcome the aforesaid problem.

Figure 2:
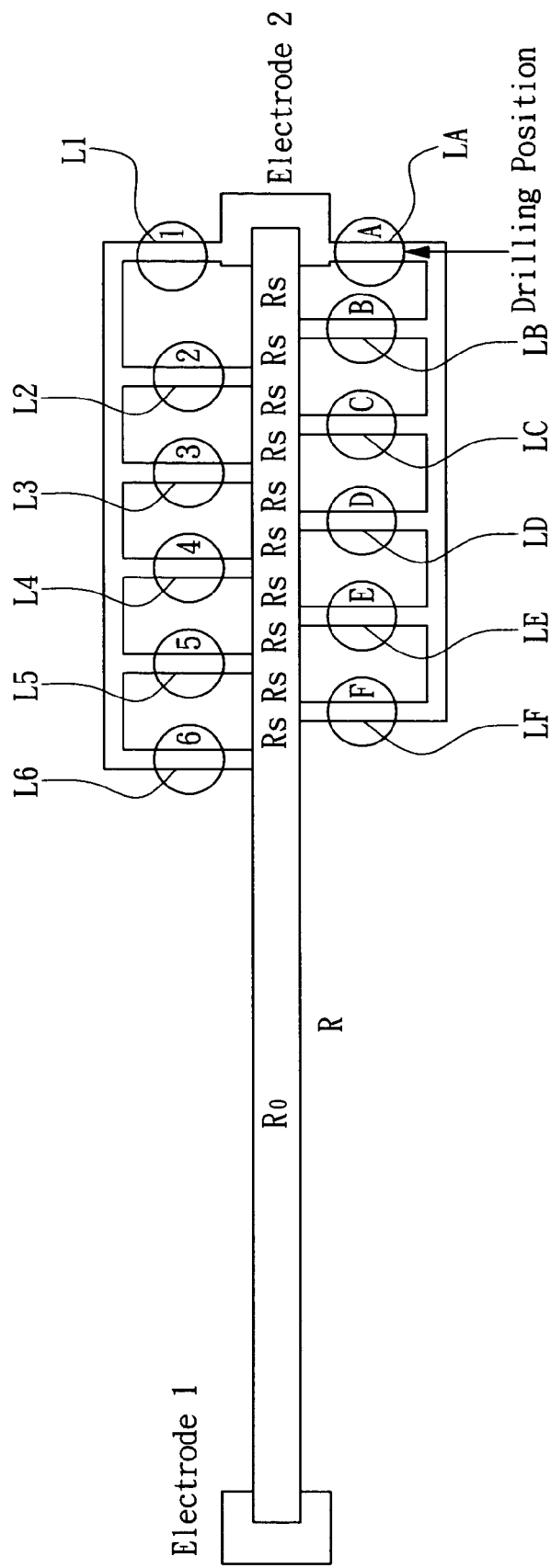
FIG. 2 is a schematic diagram showing an adjustable resistor embedded in a multi-layered substrate according to the preferred embodiment of the present invention.

FIG. 2 is a schematic diagram showing an adjustable resistor embedded in a multi-layered substrate according to the preferred embodiment of the present invention. The adjustable resistor is installed in one layer of the multi-layered substrate. The adjustable resistor R comprises a planar resistor with a plurality of terminals positioned arbitrarily. In the present embodiment, the adjustable resistor comprises a main resistor $R_0$ and a plurality of inner resistors $R_S$ connected to the main resistor $R_0$. Each of the terminals is provided with a connecting line (L1~L6 and LA~LF) drawn from each of the terminals of the planar resistor so as to form a resistor network. There are provided a plurality of drilling positions (1~6 and A~F) on the connecting lines. When the resistance value of the adjustable resistor R needs to be adjusted, the connecting lines are selectively broken by a process for drilling the substrate to form a number of combinations of opened connecting lines such that the resistance value of the adjustable resistor can be precisely adjusted.

Figure 3:
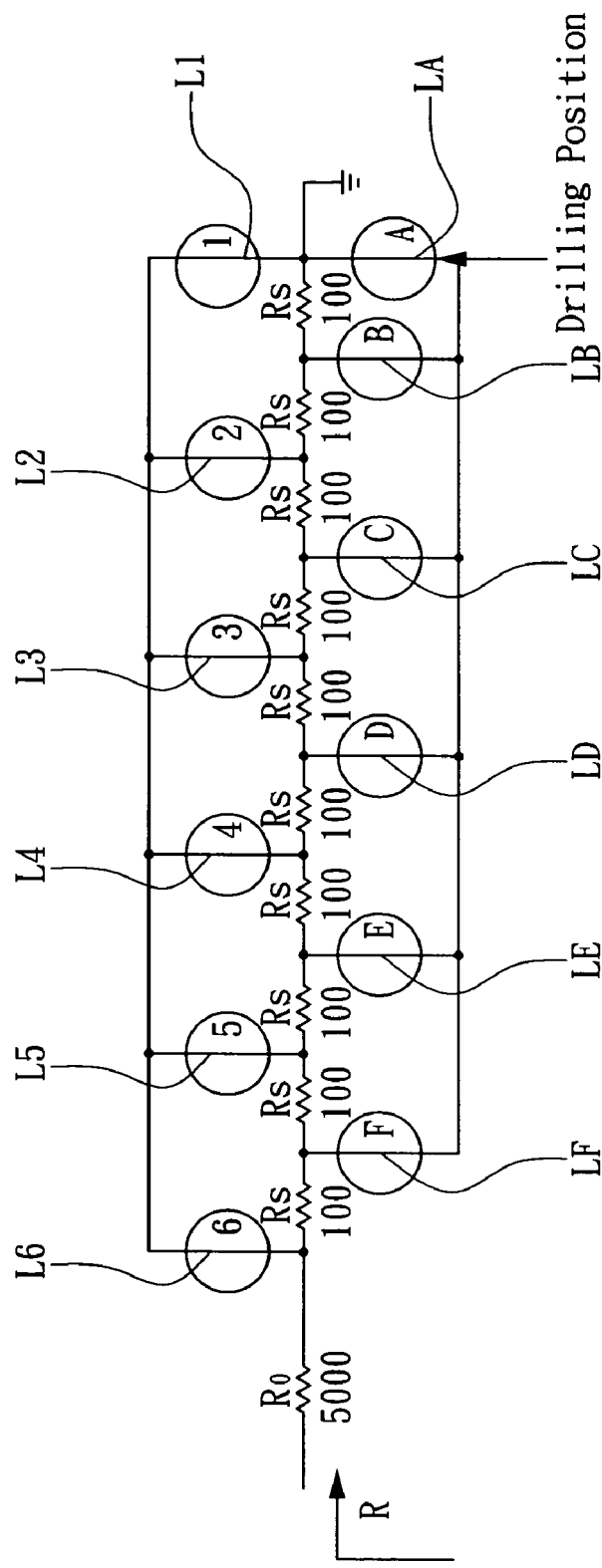
FIG. 3 is an equivalent circuit diagram showing an adjustable resistor embedded in a multi-layered substrate according to the preferred embodiment of the present invention.

FIG. 3 is an equivalent circuit diagram showing an adjustable resistor embedded in a multi-layered substrate according to the preferred embodiment of the present invention. The adjustable resistance R is an equivalent resistance viewed from the electrode 1 in FIG. 2, while the electrode 2 is connected to the ground for simplification. If the resistance of the main resistor $R_0$ is 5000 ohm and the resistance of each of the inner resistors $R_S$ is 100 ohm, at least 30 resistance values of the adjustable resistor can be obtained by selectively breaking the connecting lines on the drilling positions (1~6 and A~F) to form different combinations of opened connecting lines.

FIG. 4 is a table showing the resistance value of an adjustable resistor embedded in a multi-layered substrate according to the preferred embodiment of the present invention. For example, the drilling position selection 5 means performing drilling on the drilling positions 1, 2, 3, 4 and 5. Meanwhile, the connecting lines L1~L5 become opened since the drilling positions 1, 2, 3, 4 and 5 are drilled. The connecting line L6 becomes essentially opened and the current flowing through the main resistor $R_0$ selects to flow through the connecting line LF to the connecting line LA. Therefore, the adjustable resistor R is equivalent to the main resistor $R_0$ serially connected with an inner resistor $R_S$. Furthermore, taking drilling position selection 15 for example, drilling positions B, C, F, 1, 2, 3 and 6 are drilled and the connecting lines LB, LC, LF, L1, L2, L3 and L6 become opened. The current flows through the main resistor $R_0$, two inner resistors $R_S$, and the connecting lines L5, L4, LE and LD before it reaches the connecting line LA. Therefore, the adjustable resistor R is equivalent to the main resistor $R_0$ serially connected with two inner resistors $R_S$ connected in series and three inner resistors $R_S$ connected in parallel, i.e. $R=R_0+2R_S+(R_S\|R_S\|R_S)$.

The present invention further provides a method for forming an adjustable resistor embedded in a multi-layered substrate. Firstly, a resistor network is formed in one layer in the multi-layered substrate, the resistor network comprising a planar resistor with a plurality of terminals and a plurality of connecting lines connected to the planar resistor, each of the connecting lines being drawn from each of the terminals of the planar resistor. Then, the connecting lines are selectively broken by a process for drilling the substrate to form a number of combinations of opened connecting lines such that the resistance value of the adjustable resistor is precisely adjusted. In the present invention, the multi-layered substrate is a printed circuit board (PCB), a ceramic substrate or an integrated circuit (IC) substrate.

Figure 5:
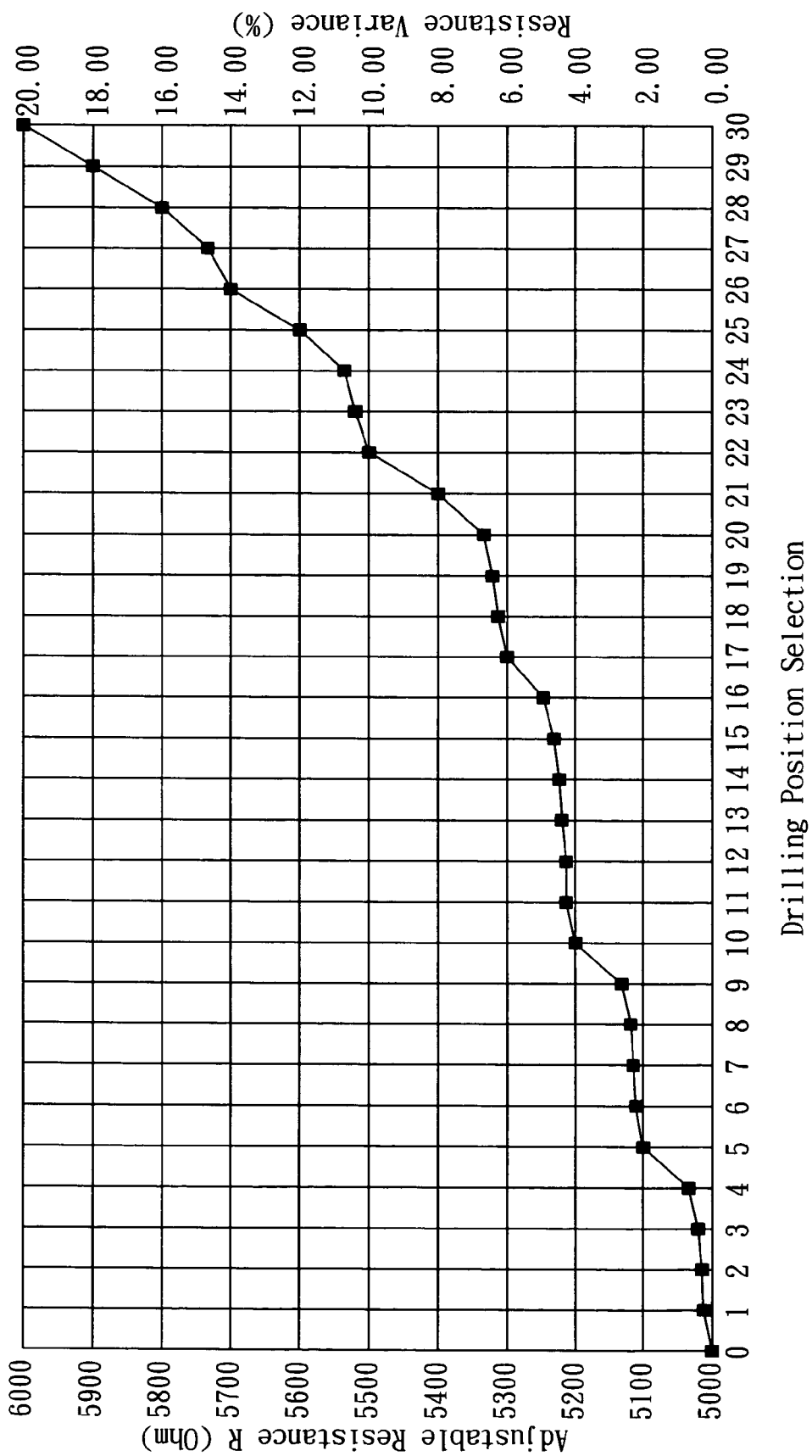
FIG. 5 is a graph showing the resistance variance of an adjustable resistor embedded in a multi-layered substrate according to the preferred embodiment of the present invention.

FIG. 5 is a graph showing the resistance variance of an adjustable resistor embedded in a multi-layered substrate according to the preferred embodiment of the present invention. More particularly, FIG. 5 shows the relation between the drilling position selection and the resistance value of the adjustable resistor R as shown in FIG. 4. In FIG. 5, it is observed, by using the adjustable resistor embedded in the multi-layered substrate according to FIG. 2, that at least 30 resistance values of the adjustable resistor can be obtained. The resistance value of the main resistor $R_0$ can be adjusted to be up to 20% higher. The resistance value of the adjustable resistor embedded in the multi-layered substrate of the present invention can be adjusted to be smaller than 1% higher or lower than the resistance value of the main resistor $R_0$. Therefore, the present invention out-performs the conventional surface coated resistor using sand-blasting trimming and laser trimming method to do the fine-tuning.

Figure 6:
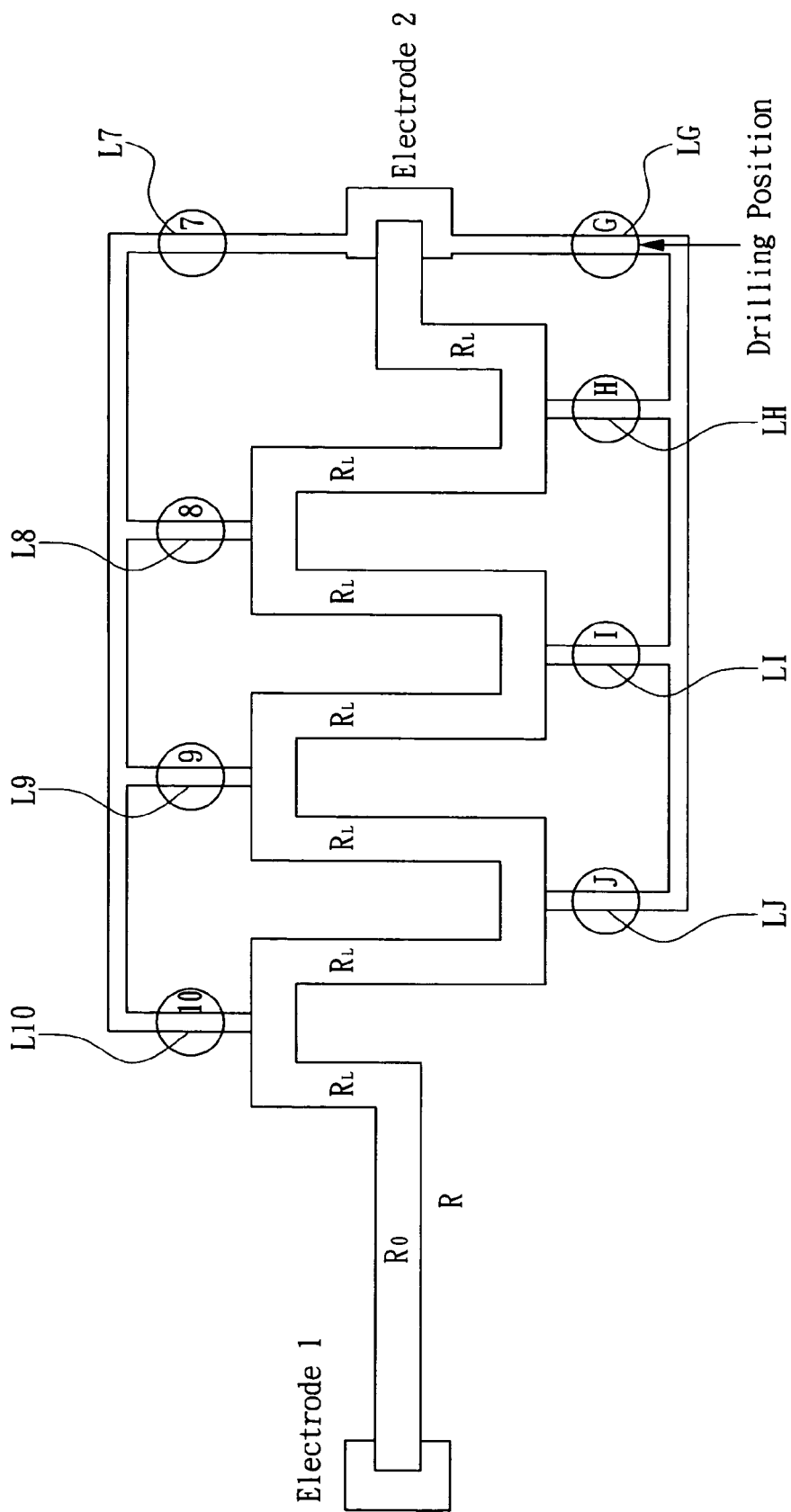
FIG. 6 is a schematic diagram showing an adjustable resistor embedded in a multi-layered substrate according to another preferred embodiment of the present invention.

FIG. 6 is a schematic diagram showing an adjustable resistor embedded in a multi-layered substrate according to another preferred embodiment of the present invention. The adjustable resistor is installed in one layer of the multi-layered substrate. The adjustable resistor R comprises a planar resistor with a plurality of terminals positioned arbitrarily. In the present embodiment, the adjustable resistor comprises a main resistor $R_0$ and a plurality of L-shaped inner resistors $R_L$ connected to the main resistor $R_0$. Each of the terminals is disposed on a shorter side of the L shape and is provided with a connecting line (L7~L10 and LG~LJ) drawn from each of the terminals of the planar resistor so as to form a resistor network. There are provided a plurality of drilling positions (7~10 and G~J) on the connecting lines. When the resistance value of the adjustable resistor R needs to be adjusted, the connecting lines are selectively broken by a process for drilling the substrate to form a number of combinations of opened connecting lines such that the resistance value of the adjustable resistor can be precisely adjusted.

Figure 7:
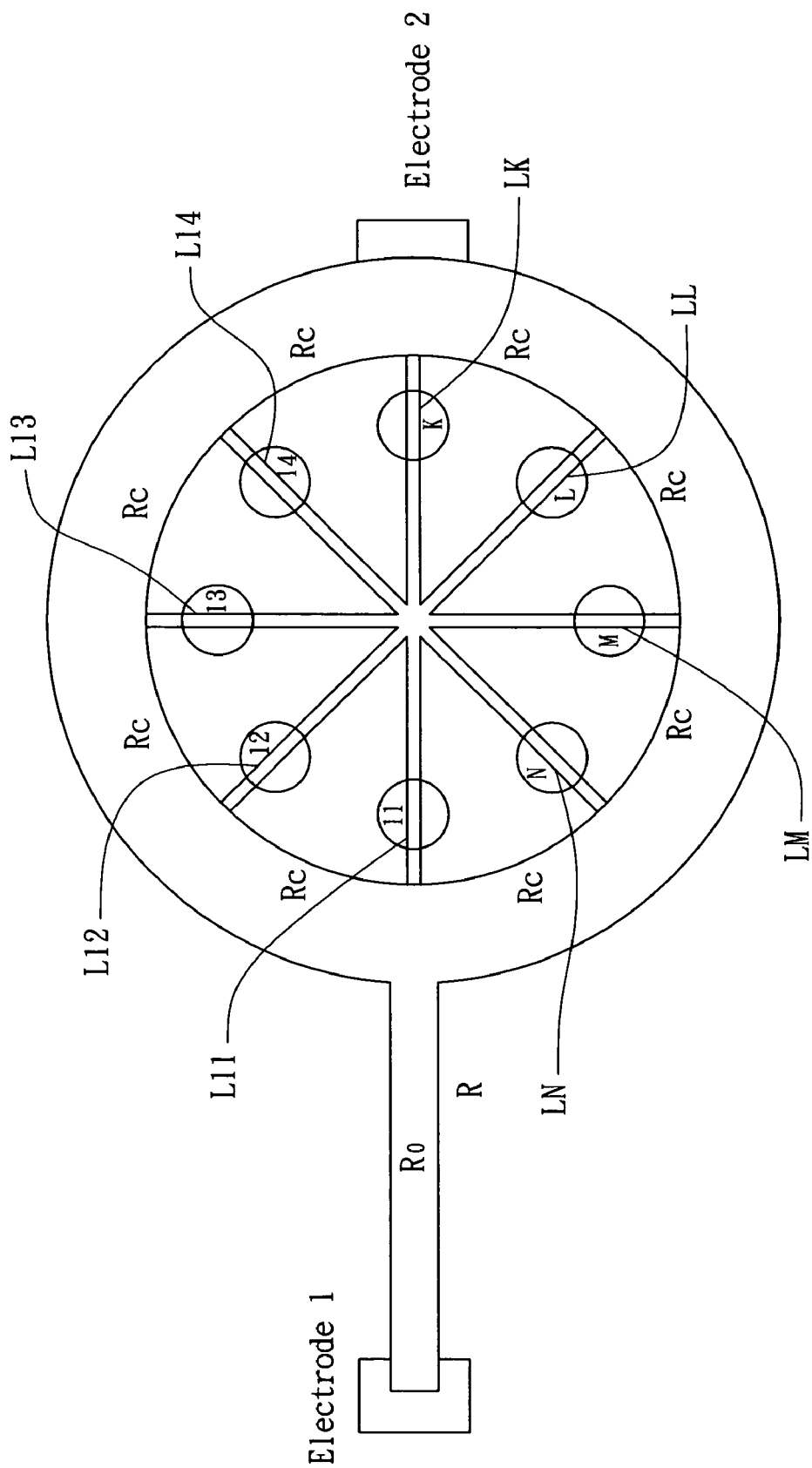
FIG. 7 is a schematic diagram showing an adjustable resistor embedded in a multi-layered substrate according to still another preferred embodiment of the present invention.

FIG. 7 is a schematic diagram showing an adjustable resistor embedded in a multi-layered substrate according to still another preferred embodiment of the present invention. The adjustable resistor is installed in one layer of the multi-layered substrate. The adjustable resistor R comprises a planar resistor with a plurality of terminals positioned arbitrarily. In the present embodiment, the adjustable resistor comprises a main resistor $R_0$ and a plurality of inner resistors $R_C$ forming a ring shape, wherein the inner resistors $R_C$ are connected to the main resistor $R_0$. Each of the terminals is provided with a connecting line (11~L14 and K~LN) drawn from the ring shape so as to form a resistor network. There are provided a plurality of drilling positions (11~14 and K~N) on the connecting lines. When the resistance value of the adjustable resistor R needs to be adjusted, the connecting lines are selectively broken by a process for drilling the substrate to form a number of combinations of opened connecting lines such that the resistance value of the adjustable resistor can be precisely adjusted.

According to the above discussion, it is apparent that the present invention discloses an adjustable resistor embedded in a multi-layered substrate and method for forming the same. The adjustable resistor comprises: a planar resistor, having a plurality of terminals; and a plurality of connecting lines connected to the planar resistor, each of the connecting lines being drawn from each of the terminals of the planar resistor so as to form a resistor network, wherein the connecting lines are selectively broken by a process for drilling the substrate to form a number of combinations of opened connecting lines such that the resistance value of the adjustable resistor is varied and thus the resistance value of the adjustable resistor can be precisely adjusted.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. An adjustable resistor comprising:
   a first electrode, arranged on one layer of a multi-layered substrate;
   a second electrode, arranged on the same layer of the substrate as the first electrode and separated apart from the first electrode in a predetermined distance;
   a planar resistor block, electrically connected between the first electrode and the second electrode, the planar resistor block having a plurality of terminals serially connected, exhibiting a main resistance and a plurality of inner resistances corresponding to the terminals respectively; and
   a plurality of connecting lines, extending from the second electrode to the terminals of the planar resistor block respectively,
   wherein the connecting lines are selectively broken by a process for drilling at least one of the connecting lines to form a number of series and parallel connection combinations of opened connecting lines such that the resistance value of the planar resistor block is precisely adjusted and is equivalent to the main resistance plus an equivalent resistance of selected terminals.

2. The adjustable resistor as recited in claim 1, wherein the plurality of terminals are arbitrarily positioned.

3. The adjustable resistor as recited in claim 1, wherein the multi-layered substrate is a printed circuit board (PCB), a ceramic substrate or an integrated circuit (IC) substrate.

4. The adjustable resistor as recited in claim 1, wherein the plurality of connecting lines extending from the second electrode and interlacing to the terminals of the planar resistor block.

5. The adjustable resistor as recited in claim 1, wherein each of the connecting lines comprises a first part and a second part correspondingly each other; the first part include the plurality of connecting lines to connect the terminals respectively; the second part include the plurality of connecting lines to connect the terminals respectively; and the first part and the second part are interlaced to the planar resistor block to form the inner resistances respectively.

6. The adjustable resistor as recited in claim 1, wherein the planar resistor block is linear.

7. The adjustable resistor as recited in claim 1, wherein the main resistance of the planar resistor block is linear and the inner resistances of the planar resistor block are L-shaped, winding shape or ring shape.

8. The adjustable resistor as recited in claim 1, wherein the inner resistances are L-shaped.

9. A method for forming an adjustable resistor, comprising steps of:
   forming a planar resistor block electrically between a first electrode and a second electrode which are arranged on one layer of a multi-layered substrate, the planar resistor block having a plurality of terminals serially connected, exhibiting a main resistance and a plurality of inner resistances corresponding to the terminals respectively, and a plurality of connecting lines extending from the second electrode to the terminals of the planar resistor block; and
   selectively breaking the connecting lines by a process for drilling the connecting lines to form a number of series and parallel connection combinations of opened connecting lines such that the resistance value of the planar resistor block is precisely adjusted and is equivalent to the main resistance plus an equivalent resistance of selected terminals.

10. The method for forming an adjustable resistor as recited in claim 9, wherein the plurality of terminals are arbitrarily positioned.

11. The method for forming an adjustable resistor as recited in claim 9, wherein the multi-layered substrate is a printed circuit board (PCB), a ceramic substrate or an integrated circuit (IC) substrate.

12. The method for forming an adjustable resistor as recited in claim 9, wherein the inner resistances formed a ring shape, and the plurality of connecting lines extending from each of the terminals and centralizing at one point disposed inside the ring-shaped inner resistances.

13. The method for forming an adjustable resistor as recited in claim 9, wherein the plurality of connecting lines extending from the second electrode and interlacing to the terminals of the planar resistor block.

14. The method for forming an adjustable resistor as recited in claim 9, wherein each of the connecting lines comprises a first part and a second part correspondingly each other; the first part include the plurality of connecting lines to connect the terminals respectively; the second part include the plurality of connecting lines to connect the terminals respectively; and the first part and the second part are interlaced to the planar resistor block to form the inner resistances respectively.

15. The method for forming an adjustable resistor as recited in claim 9, wherein the planar resistor block is linear.

16. The method for forming an adjustable resistor as recited in claim 9, wherein the main resistance of the planar resistor block is linear and the inner resistances of the planar resistor block are L-shaped, winding shape or ring shape.

17. The method for forming an adjustable resistor as recited in claim 9, wherein the inner resistances formed a ring shape, and the plurality of connecting lines extending from each of the terminals and centralizing at one point disposed inside the ring-shaped inner resistances.

18. The method for forming an adjustable resistor as recited in claim 9, wherein the inner resistances are L-shaped.

* * * * *